United States Patent [19]

Hoover

[11] Patent Number: 5,452,181
[45] Date of Patent: Sep. 19, 1995

[54] DETACHABLE APPARATUS FOR COOLING INTEGRATED CIRCUITS

[75] Inventor: John W. Hoover, Huntington, Conn.

[73] Assignee: Nidec Corporation, Torrington, Conn.

[21] Appl. No.: 192,264

[22] Filed: Feb. 7, 1994

[51] Int. Cl.6 ............................................. H05K 7/20
[52] U.S. Cl. ................................. 361/697; 165/80.3; 257/713; 361/718
[58] Field of Search ................... 174/16.3; 62/259.2; 165/80.3, 185, 122, 126; 257/707, 706, 713, 718, 722; 361/687, 690, 694, 695, 697, 703, 704, 707, 709, 718

[56] References Cited

U.S. PATENT DOCUMENTS

| | | | |
|---|---|---|---|
| 3,686,533 | 8/1972 | Garnier et al. | 317/100 |
| 4,489,363 | 12/1984 | Goldberg | 361/383 |
| 4,541,004 | 9/1985 | Moore | 357/81 |
| 4,546,405 | 10/1985 | Hultmark et al. | 361/386 |
| 4,611,238 | 9/1986 | Lewis et al. | 357/81 |
| 4,620,216 | 10/1986 | Horvath | 357/81 |
| 4,682,651 | 7/1987 | Gabuzda | 165/80.3 |
| 4,715,430 | 12/1987 | Arnold et al. | 165/80.3 |
| 4,733,293 | 3/1988 | Gabuzda | 357/81 |
| 4,812,733 | 3/1989 | Tobey | 323/285 |
| 5,191,230 | 3/1993 | Heung | 307/141 |
| 5,280,409 | 1/1994 | Selna | 361/720 |
| 5,288,203 | 2/1994 | Thomas | 415/178 |
| 5,299,632 | 4/1994 | Lee | 361/697 |
| 5,309,983 | 5/1994 | Bailey | 165/80.3 |
| 5,316,077 | 5/1994 | Reichard | 165/104.28 |
| 5,332,979 | 7/1994 | Roskewitsch | 331/68 |

FOREIGN PATENT DOCUMENTS 2-286900 11/1990 Japan .
3-229492 10/1991 Japan .

OTHER PUBLICATIONS

Literature re Thermalloy TCM ™ by Thermalloy, Inc., 1 sheet, at least as early Feb. 1993.
"Velox Backgrounder" by Velox Computer Technology, Inc., 6 sheets, at least at early as Feb. 1993.
R. Mitchell, "The Experimental Step 486/50 Redefines Cool", *BYTE*, Dec. 1990, 1 sheet.
Literature re Velox "ICECAP ™" by Velox Computer Technology, Inc., Nov. 1991, 10 sheet.

*Primary Examiner*—Gerald P. Tolin
*Attorney, Agent, or Firm*—McCormick, Paulding & Huber

[57] ABSTRACT

An apparatus for cooling an integrated circuit device has a fan detachably mounted to a heat sink, and the heat sink is in turn mounted to an exposed surface of the integrated circuit. The heat sink includes a pair of mounting posts, and the fan assembly includes corresponding mounting recesses for receiving the mounting posts. The mounting recesses are dimensioned to form an interference fit with the corresponding mounting posts, in order to retain the mounting posts within the mounting recesses. Alternatively, the fan assembly has biased tabs, which are received within corresponding recesses formed on the integrated circuit device to detachably mount the fan to the heat sink and integrated circuit. An electrical connector with biased terminals is mounted on the fan, and the biased terminals engage corresponding terminals on the integrated circuit upon mounting the fan to the heat sink.

17 Claims, 5 Drawing Sheets

DETACHABLE APPARATUS FOR COOLING INTEGRATED CIRCUITS

FIELD OF THE INVENTION

The present invention relates to heat transfer apparatus, and more particularly, to heat transfer apparatus for mounting to electronic components, such as integrated circuits, to cool the electronic components, and which are detachable from the electronic components for repair or replacement.

BACKGROUND INFORMATION

The circuit densities in modern integrated circuit devices require that the heat generated during operation of such devices be efficiently removed in order to maintain desirable operating temperatures (e.g., less than 85° C.) to maximize processing speed and reliability, and prevent destruction of such devices by overheating. A typical microprocessor may comprise over 1 million transistors, operating at 50 megahertz, and the trend in the semiconductor industry today, is to make microprocessors smaller and more powerful (i.e., more transistors operating at a faster speed). As the heat generated by typical microprocessors increases, the difficulties encountered in providing compact, thermally-efficient, and reliable cooling devices becomes more critical.

A common approach to supplemental cooling has been to attach heat sinks with cooling fins to integrated circuit devices. Typical heat sinks for attachment to integrated circuits are illustrated in U.S. Pat. Nos. 4,541,004, 4,546,405, 4,611,238, 4,620,216 and 4,682,651. Other supplemental cooling devices include fans mounted on the heat sinks to increase cooling capacity. In one such device, the fan is mounted on top of the heat sink and is attached to the heat sink by threaded fasteners. The heat sink includes four plastic tabs, and each tab depends downward from a respective corner of the heat sink. When the heat sink is mounted on the casing of an electronic device, each of the four tabs is snapped into a respective recess formed in the casing in order to lock the heat sink and fan assembly to the casing. In order to unlock the heat sink and fan assembly from the casing, a tool is necessary to release the tabs from the corresponding recesses. Similarly, in order to remove the fan from the heat sink, the threaded fasteners must be removed by a screwdriver.

Thermoelectric cooling devices, such as the "ICECAP" module manufactured by Velox Computer Technology, Inc. of Sanka Clara, Calif., have also been developed to increase cooling capacity. The Velox device comprises a Peltier-effect thermoelectric cooler, including a "cold" plate attached to the microprocessor, a "hot" plate attached to a heat sink, and two semiconductors having dissimilar electrical properties (n-type and p-type semiconductors) mounted between the hot and cold plates. When a voltage is applied to the cooler, the hot plate side becomes relatively warm and the cold plate side becomes relatively cool (the Peltier effect), thus transferring the heat generated by the microprocessor from the cold plate to the hot plate, and in turn to the heat sink. An optional fan is mounted in a fixed fashion by threaded fasteners to the heat sink, which blows air through the cooling fins of the heat sink, dissipating the heat within the module.

Although the thermoelectric cooler has a higher cooling capacity than a typical heat sink, it is relatively expensive. Also, these types of supplemental cooling devices with integral fans can become a limiting factor in the reliability of associated integrated circuit devices. Typically, the expected operational life of a fan is less than that of a microprocessor. However, with a modern, more powerful microprocessor, if the supplemental cooling fan fails, continued operation of the microprocessor will frequently cause it to overheat and destroy itself, possibly within a matter of minutes. Because known supplemental cooling fans are fixedly attached to the microprocessors and/or to the heat sinks attached to the microprocessors, when such a cooling fan fails, typically the associated microprocessor must be discarded.

SUMMARY OF THE INVENTION

The present invention is directed to an apparatus for cooling an integrated circuit device, comprising a heat transfer body defining a mounting surface for attachment to the integrated circuit to transfer heat away from the circuit. A fan assembly is coupled to the body for moving air across the body to enhance the transfer of heat away from the integrated circuit. The cooling apparatus also includes means for detachably mounting the fan assembly to the heat transfer body.

In one embodiment of the present invention, the means for detachably mounting includes at least one mounting surface formed on either the heat transfer body or the fan assembly, and at least one corresponding mounting aperture formed in the other of the heat transfer body or fan assembly for receiving the corresponding mounting surface. In one embodiment of the present invention, the mounting surface is defined by a first radius of curvature, and a surface defining the corresponding mounting aperture is defined by a second radius of curvature which is dimensioned to form an interference fit with the first radius of curvature. In another embodiment of the present invention, the mounting surface is normally biased toward the corresponding mounting aperture, to retain the mounting surface within the mounting aperture.

An apparatus of the present invention preferably further comprises an electrical connector coupled to the fan assembly, and defining at least one biased terminal for engagement with a corresponding terminal on the integrated circuit upon attachment of the fan assembly to the heat transfer body. Preferably, the electrical connector includes several terminal surfaces, each normally biased toward the integrated circuit, and the circuit includes several corresponding terminal surfaces for contacting the biased surfaces on the connector.

One advantage of the apparatus of the present invention, is that if the fan assembly fails, it can be easily and rapidly removed from the heat transfer body and/or integrated circuit device and replaced with a new fan assembly. With the apparatus of the present invention, fan life is therefore no longer a limiting factor in the life span of a microprocessor. Rather, when the fan fails, it can be easily detached and replaced with a new fan assembly by an end user.

Other advantages of the present invention will become apparent in view of the following detailed description of preferred embodiments and the accompanying drawings.

DETAILED DESCRIPTION OF THE PREFERRED EMBODIMENTS

Figure 1:
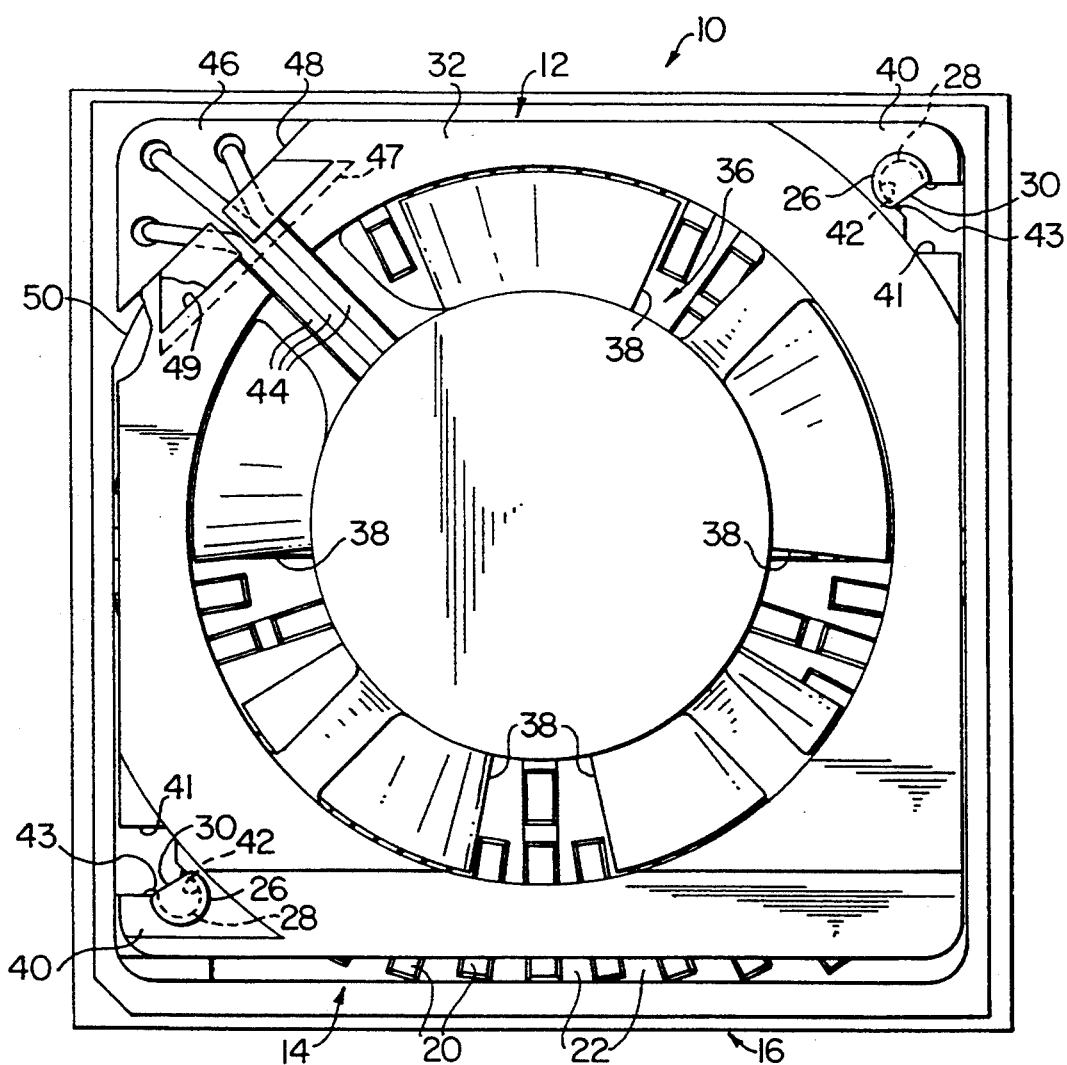
FIG. 1 is a top plan view of a cooling apparatus embodying the present invention.
Figure 2:
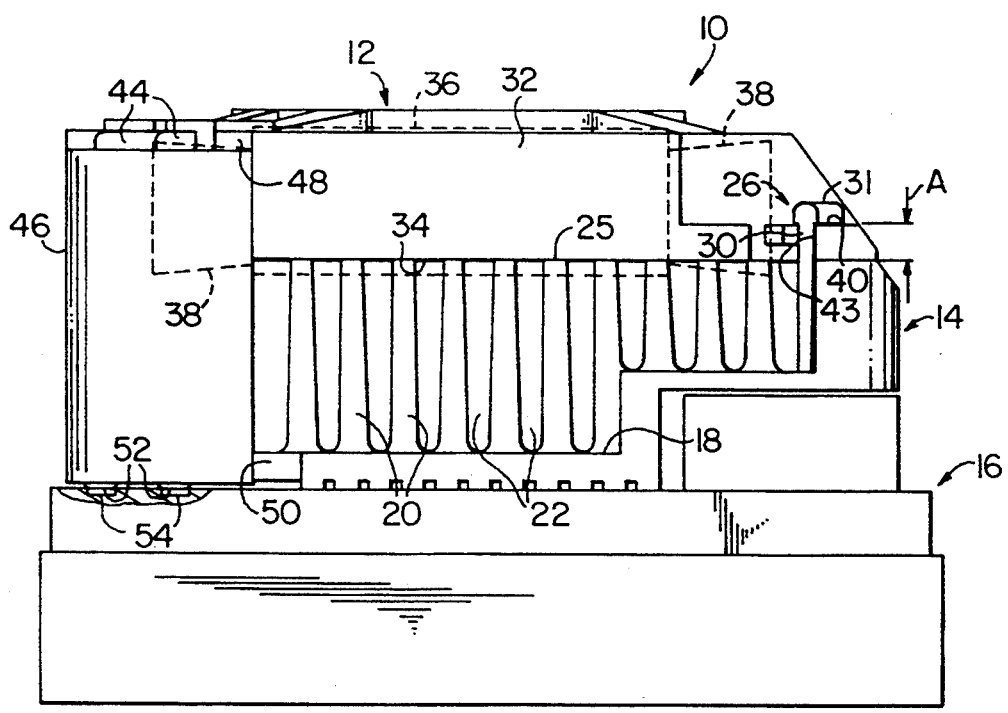
FIG. 2i side plan view, in partial cross-section, of the cooling apparatus of FIG. 1.

In FIGS. 1 and 2, an apparatus embodying the present invention for cooling integrated circuit devices is indicated generally by the reference numeral 10. The apparatus 10 comprises a fan assembly 12 detachably mounted to a heat transfer body in the form of a heat sink 14, which is in turn mounted to an integrated circuit device or microprocessor 16. The construction of the fan assembly 12 and heat sink 14 is the same in certain respects as the construction of corresponding components disclosed in patent application Ser. No. 07/965,654, now U.S. Pat. No. 5,282,203, entitled "Low Profile Fan Body With Heat Transfer Characteristics", which is assigned to the same assignee as is the present invention, and is hereby expressly incorporated by reference as part of the present disclosure.

The heat sink 14 defines a base wall 18 shaped to conform to the opposing top surface of the microprocessor 16, which in the embodiment of the present invention illustrated defines a recess on the underside of the base wall for accommodating a surface mounted component of the microprocessor, as shown in FIG. 2. The base wall 18 is preferably attached to the microprocessor 16 in a fixed fashion, such as by employing a heat-conductive epoxy or similar adhesive (not shown) to the interface between the base wall 18 and the microprocessor, in a manner known to those of ordinary skill in the pertinent art. If desired, a plurality of raised surface areas and corresponding depressed surface areas can be formed on either or both sides of the base wall 18 to increase the surface areas of the base wall, and enhance the heat transfer characteristics of the heat sink 14.

Figure 3:
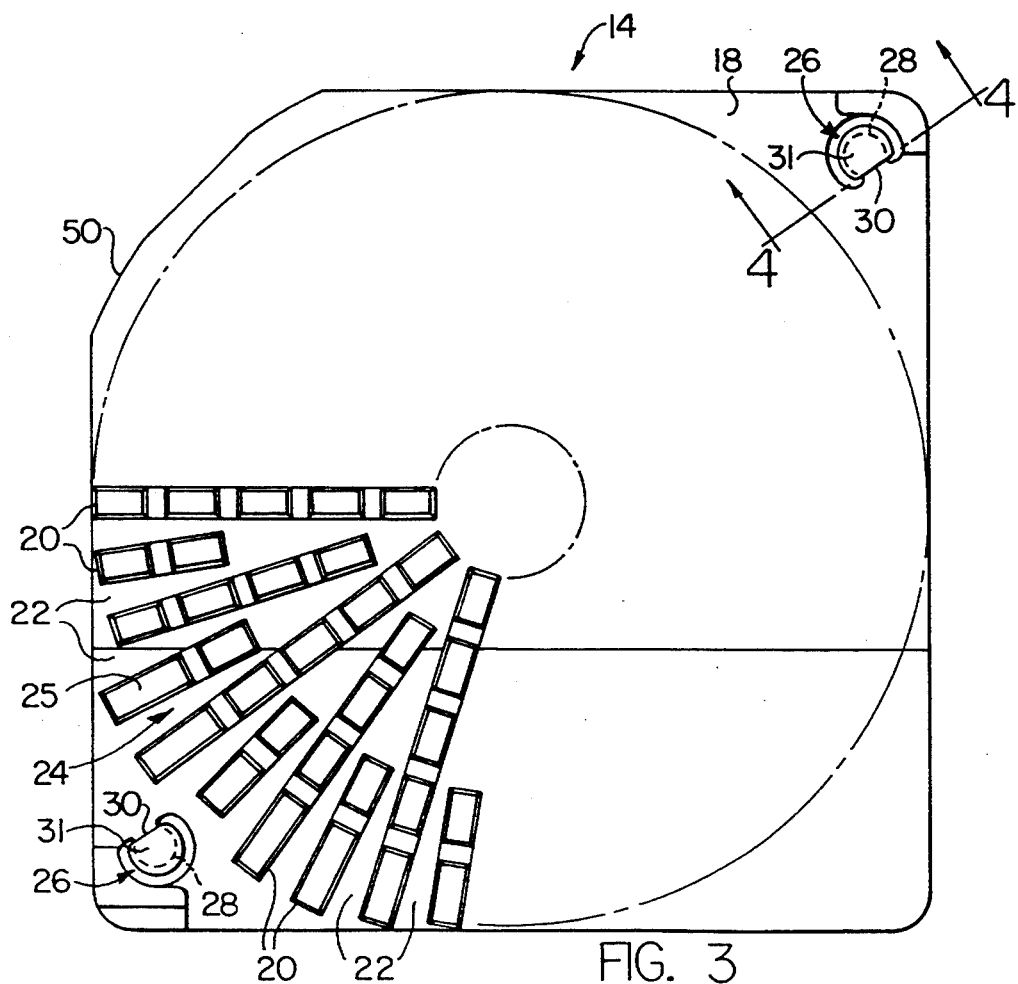
FIG. 3 is a top plan view of the heat sink of the cooling apparatus of FIG. 1.

As shown in FIGS. 2 and 3, the heat sink 14 includes a plurality of cooling fins 20 spaced apart from each other in rows along the periphery of the base wall 18, and defining a plurality of cooling apertures 22 between adjacent cooling fins for air flow between the fins. The cooling fins 20 project upward from, and are oriented substantially normal to the base wall 18, and the rows of cooling fins define a plenum chamber 24 within the heat sink. As shown in FIGS. 2 and 3, each cooling fin 20 defines a substantially flat top surface 25, and the surfaces 25 are each oriented in substantially the same plane, defining mounting surfaces for seating the fan assembly 12, as is described further below.

Figure 4:
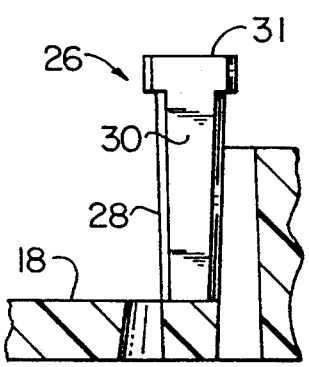
FIG. 4 is a partial, cross-sectional view of the heat sink of FIG. 3 taken along the line 4—4 of FIG. 3.

A pair of mounting posts 26 are fixedly mounted on diametrically opposite corners of the heat sink 14 relative to each other, and project upward from the base wall 18 of the heat sink. As shown in FIG. 3, each post 26 defines a semi-cylindrical surface 28 and a flat 30 formed between the ends of the semi-cylindrical surface. Each semi-cylindrical surface 28 is dimensioned to be received within a corresponding mounting recess formed within the fan assembly 14, for rotatably attaching and detaching when the fan to and from the heat sink, as is described further below. As shown typically in further detail in FIG. 4, an expanded stop portion 31 is formed on the top of each post 26 to prevent removal of the fan assembly 12 from the heat sink 14 in the longitudinal direction of the respective post, as is also described further below. As also shown in FIG. 4, each semi-cylindrical surface 28 and flat 30 taper inwardly in the direction from the respective stop portion 31 toward the base wall 18, to facilitate molding of the heat sink.

The fan assembly 12 includes a frame 32 defining a base surface 34, which is seated on the top surfaces 25 of the cooling fins 20 of the heat sink. A fan 36 is rotatably mounted in the center of the frame 32, and includes a plurality of fan blades 38 spaced relative to each other along the circumference of the fan and projecting downward into the plenum chamber 24. Because the fan blades 38 project into the plenum chamber 24 and do not terminate above the heat sink, as is typically the case with prior art fan/heat sink assemblies, the fan/heat sink assembly has a relatively low profile when assembled, minimizing the space requirements of the cooling apparatus.

The frame 32 defines two flange portions 40, each located on a respective corner of the frame on diametrically opposite sides of the frame relative to each other. Each flange portion 40 defines a respective cutout 41 in the edge of the flange portion, and a semi-circular mounting recess 42 extending through the flange adjacent to the respective cutout. As shown in FIG. 1, each mounting recess 42 is dimensioned to receive the semi-cylindrical surface 28 of a respective mounting post 26 of the heat sink. Each mounting recess 42 defines an entrance opening 43, which has a sufficient width (in a direction transverse to the axial direction of the fan assembly) to permit passage of the respective semi-cylindrical surface 28 there through. The radius of curvature of the surface defining each mounting recess 42 is dimensioned to form an interference fit with the semi-cylindrical surface 28 of the corresponding mounting post 26, to lock each mounting post within the respective mounting recess. As shown in FIG. 2, the thickness of each flange portion 40 is slightly less than the distance A between the base of each expanded stop portion 31 and the top surfaces 25 of the cooling fins, to receive and firmly retain the flange portions beneath the stop portions.

Figure 5:
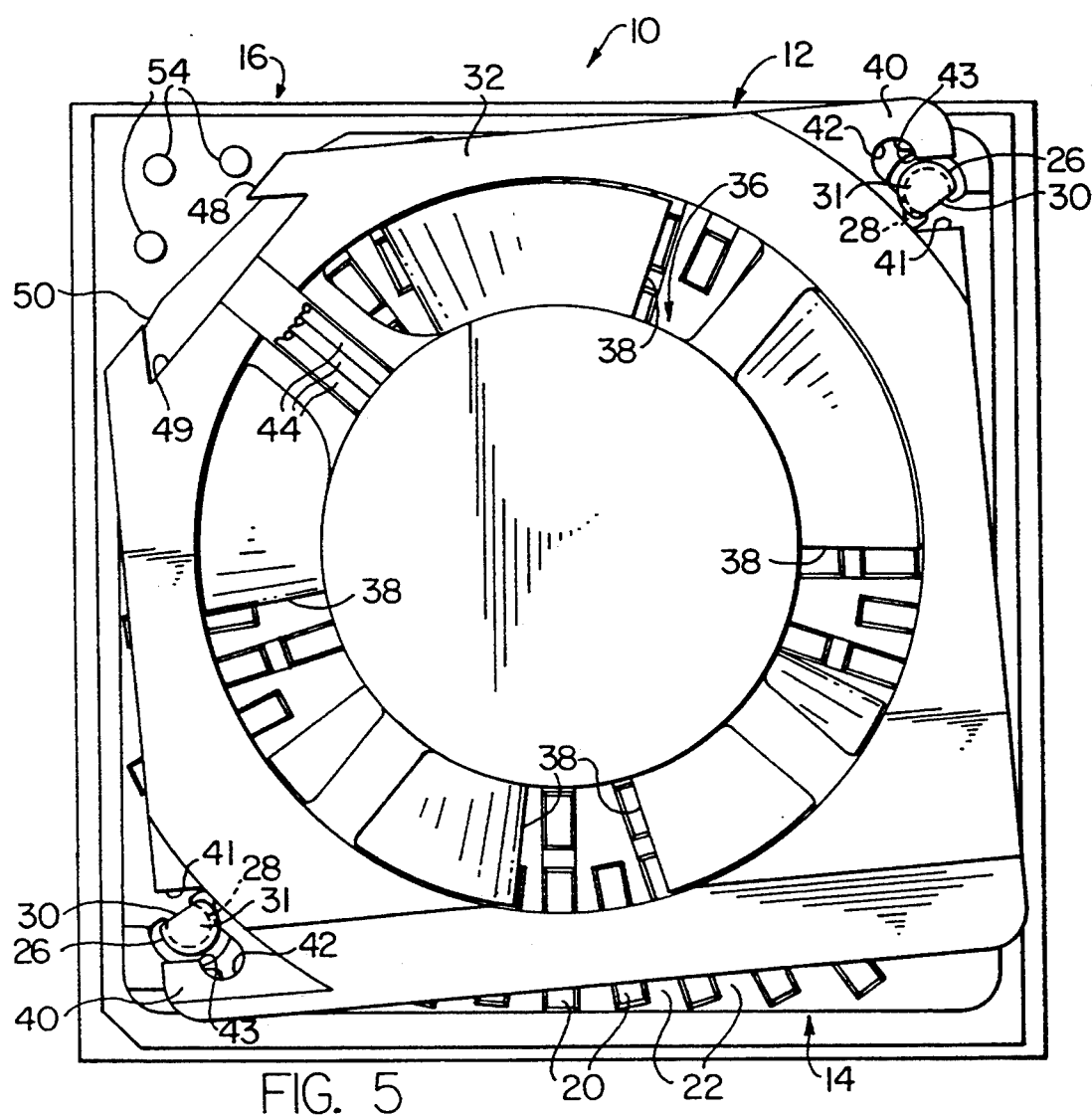
FIG. 5 is a top plan view of the cooling apparatus of FIG. 1 illustrating the fan assembly rotated slightly with respect to the heat sink during either detachment or attachment of the fan assembly.

As shown in FIG. 5, the fan assembly 12 is mounted to the heat sink 14 by initially seating the base surface 34 of the fan on the top surfaces 25 of the cooling fins, with the fan assembly rotated slightly with respect to the heat sink (approximately 5° to 15°) so that each mounting post 26 is located within the cutout 41 of the respective flange portion 40. The fan assembly 12 is then rotated in the clockwise direction relative to the heat sink 14, which in turn moves each mounting recess 42 toward the corresponding mounting post 26. When each semi-cylindrical surface 28 engages the walls defining the corresponding access opening 43, a slight force is required to pass the semi-cylindrical surface through the access opening, and in turn receive the semi-cylindrical surface within the corresponding mounting recess. Because the radius of curvature of the surface defining each mounting recess 42 is dimensioned to form an interference fit with the semi-cylindrical surface 28 of the corresponding mounting post 26, the fan assembly 12 is effectively locked in place with respect to the heat sink, and cannot be moved unless a sufficient rotational force is applied to the fan assembly in the counter-clockwise direction to release the mounting posts from the mounting recesses.

The fan assembly 12 includes several wire leads 44 for connecting the fan 36 to the microprocessor 16 to control operation of the fan. Each wire lead 44 is coupled on one end to the fan 36 and coupled on the other end to an electrical connector 46. As illustrated in FIGS. 1 and 2, the frame 32 of the fan assembly 12 defines a flat 48 on one corner, and the heat sink 14 defines a recessed surface 50 for accommodating the electrical connector 46. The electrical connector 46 includes a dove-tail key 47 fixedly mounted on one side of the connector, and the frame 32 defines a corresponding recess 49 within the first flat 48 for receiving the dove-tail key to mount the electrical connector to the fan assembly.

The electrical connector 46 is preferably a biased-type connector, defining on the end adjacent to the microprocessor 16 several gel bumps 52, each being electrically coupled to a respective wire lead 44. The gel bumps 52 each project outward from the end of the electrical connector 46 toward the top surface of the microprocessor 16, and each gel bump defines a respective terminal surface for electrical connection to the microprocessor. The microprocessor 16 includes corresponding terminals 54 located on the top surface of the microprocessor, and each terminal 54 is aligned with a respective gel bump 52 when the fan assembly is locked in place on the heat sink to form an electrical connection with the gel bump, as shown in FIG. 2.

In the embodiment of the present invention illustrated, the terminals 54 are gold-plated surface pads, and the electrical connector 46 is a flexible, conductive gel-type connector, such as the conductive gel connector manufactured by AMP, Inc. of Harrisburg, Pa. Each gel bump 52 is made of a compressible, conductive gel formulation. The length of the gel-type connector 46 in the axial direction of the fan assembly is selected so that when the fan assembly is not attached to the heat sink 14, the gel bumps 52 project outward slightly beyond the base surface of the heat sink. Then, when the fan assembly 12 is mounted to the heat sink 14 as described above, the gel bumps 52 are pressed into engagement with the corresponding terminal pads 54 of the microprocessor, and maintained in engagement with the terminal pads by means of the compressible, flexible nature of the gel bumps.

Figure 6:
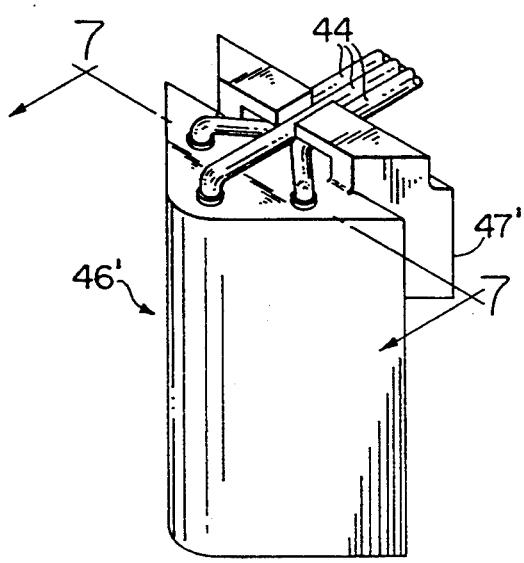
FIG. 6 is a perspective view of an alternative embodiment of the electrical connector for the apparatus of FIG. 1.
Figure 7:
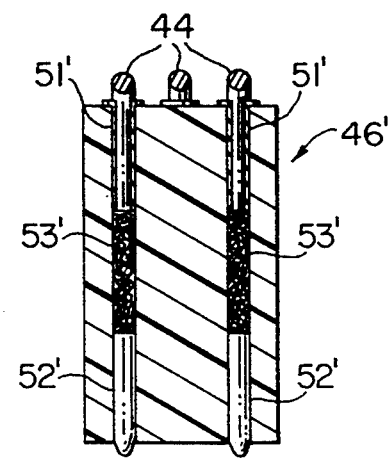
FIG. 7 is a cross-sectional view of the electrical connector of FIG. 6, taken along the line 7—7 of FIG. 6.

Turning to FIGS. 6 and 7, another electrical connector 46' is illustrated, which can be used with the apparatus 10 instead of the electrical connector 46. The electrical connector 46' is similar in construction to the electrical connector 46, and includes a dove-tail key 47', which is received within the corresponding recess 49 of the frame 32 to detachably mount the connector to the fan assembly. Each wire lead 44 is connected through a respective crimp contact 51' to a button-type contact 53', which is in turn connected to one end of a plunger 52'. Each button contact 53' transmits a force against the corresponding plunger 52', which projects downward from the base of the connector into engagement with a corresponding terminal pad 54 on the microprocessor. This type of connector can be purchased from Cinch, Connector Division, of Elk Grove Village, Ill. Each button contact 53' may be constructed of randomly-wound, molybdenum wire, and each plunger 52' may be a gold-plated, brass plunger. Like the gel-bumps 52, the plungers 52' are normally biased into engagement with the terminal pads 54 of the microprocessor to automatically make the electrical connection upon attachment of the fan assembly to the heat sink and microprocessor.

Numerous other types of flexible or biased connectors can also be employed in the apparatus of the present invention. For example, a "pogo-stick" or "pogo-pin" connector, which has a spring-biased tip for contacting the terminals on the microprocessor 16, or a "leaf spring" connector, also having a spring-biased tip for contacting the terminals on the microprocessor, may equally be employed instead of the connectors 46 or 46' described above. In each of these alternative situations, several connectors may be required, i.e., one connector for each wire lead. It may also be desirable to eliminate the wire leads 44, and extend the circuit board (not shown) of the fan assembly over the connector 46 or 46' to directly contact the terminals of the connector. In this case, each terminal of the connector would be normally biased upward into contact with the circuit board of the fan assembly.

One advantage of the apparatus of the present invention, is that if the fan fails, the fan assembly can be easily removed and replaced by a new fan assembly. An end user or computer owner can open the housing on the computer, and simply twist and remove the broken fan assembly from the heat sink. A new fan assembly is then installed by placing the new fan on top of the original heat sink, and rotating the fan assembly until the mounting posts of the heat sink are snapped into the respective mounting recesses of the fan assembly. The electrical connection between the fan and the microprocessor is automatically made when the fan is mounted in place, as described above. There is no need for special expertise to replace the fan assembly, nor is there need for any tools, other than possibly a screw driver to open the computer housing and access the fan and heat sink assembly. Accordingly, with the apparatus of the present invention, the fan assembly is no longer a limiting factor in the life span of an integrated circuit device, in contrast to prior art supplemental cooling devices in which the fan assembly is fixedly mounted to the microprocessor and/or to the heat sink, and thus cannot be easily removed and replaced.

Another advantage of the apparatus of the present invention, is that the fan assembly 12 can be configured so that one of the wire leads 44 transmits a signal indicative of fan operation to the microprocessor 16. For example, during fan operation, a low signal is transmitted, whereas in the event of a fan failure, a high signal is transmitted. The microprocessor 16 is preferably programmed to monitor this signal, and in the event of a fan failure (a high signal), the microprocessor generates a visible warning to an operator to replace the fan assembly, and preferably automatically enters into a "managed shut down" mode in which the microprocessor operates at a slower speed permitting continued operation of the microprocessor, if necessary, but generating less heat and preventing damage to the microprocessor. When the work being performed by the microprocessor at the time of fan failure is completed, or when the operator otherwise completes the work performed under the managed shut down mode, the microprocessor can be shut down, and the fan assembly quickly replaced, as described above.

Figure 8:
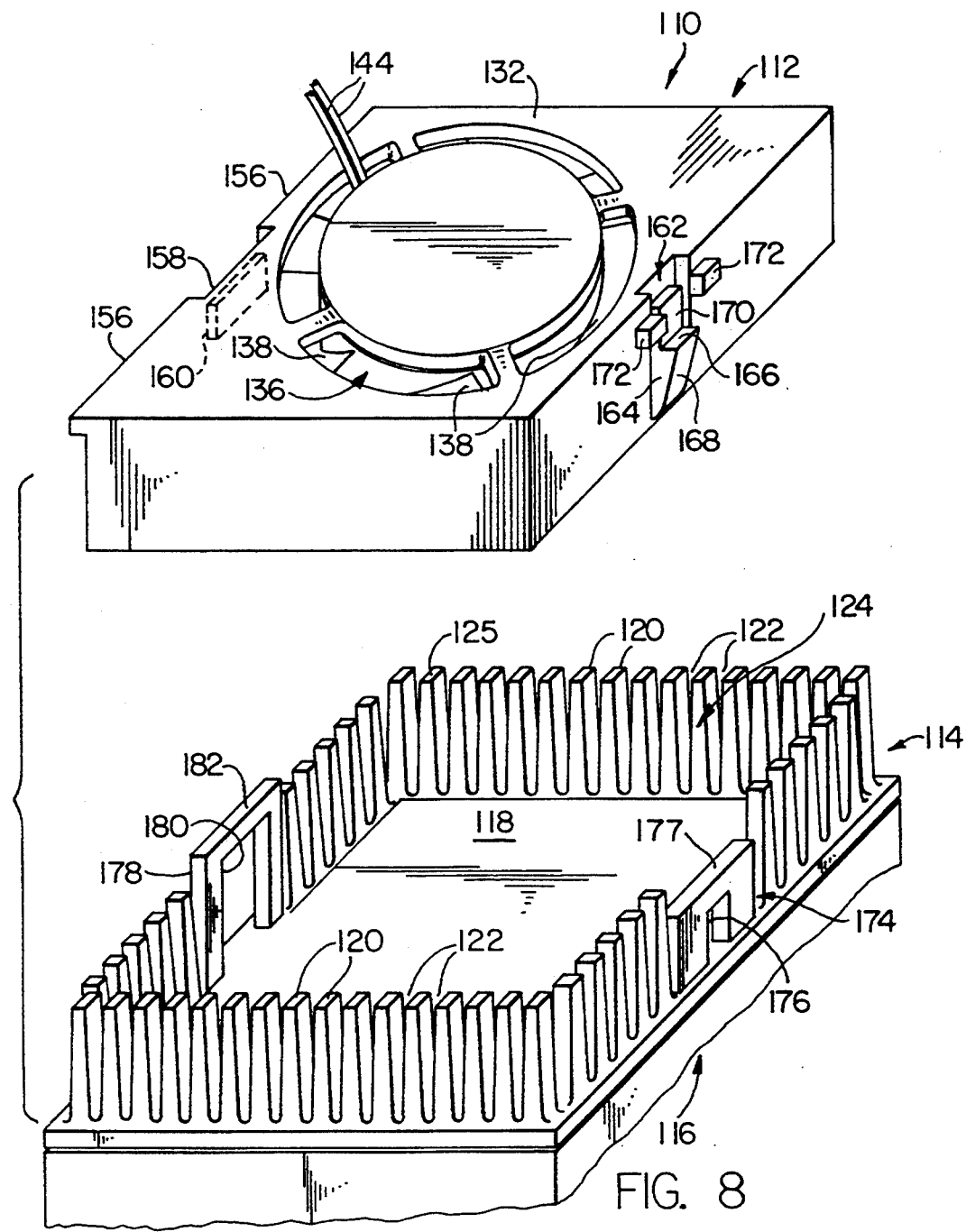
FIG. 8 is an exploded perspective view of another embodiment of a cooling apparatus of the present invention in which the fan assembly is detachably mounted to the heat sink by means of a snap-in lever mechanism.

Turning to FIG. 8, another embodiment of the present invention is indicated generally by the reference numeral 110. The cooling apparatus 110 is the same in most respects as the apparatus 10 described above, and therefore like reference numerals preceded by the numeral 1 are used to indicated like elements. The primary difference of the cooling apparatus 110 in comparison to the apparatus 10 is the structure for detachably mounting the fan assembly 112 to the heat sink 114, and the electrical connection for the fan assembly.

The fan assembly 112 defines a pair of first mounting tabs 156 spaced apart from each other on one side of the frame 132 and defining a gap 158 between them. A second mounting tab 160 also projects outward from the frame 132, and is spaced below the gap 158 approximately mid-way between the two first mounting tabs 156, as illustrated in dashed lines in FIG. 8. A mounting latch or lever 162 is located on the opposite side of the frame 132 relative to the mounting tabs 156, and includes a flexible leg 164 fixedly mounted on one end to the frame and projecting upward in substantially the axial direction of the fan. The flexible leg 164 defines a lip 166, and a sloped surface 168 tapering inward from the lip to the base of the leg. A lever portion 170 projects upward from the free end of the leg 164, and can be manipulated to flex the leg toward the frame 132 to release the mounting latch from the heat sink, as is described further below. A pair of stop portions 172 are formed on the frame 132 on opposite sides of the leg 164 relative to each other, and are aligned with each other immediately above the lip 166.

The heat sink 114 includes a latch mount 174 projecting upward from the base wall 118, and defining a mounting aperture 176 for receiving the lip 166 of the mounting latch. A recessed surface 177 is formed on top of the latch mount 174, and is spaced below the top surfaces 125 of the cooling fins for engaging the stop portions 172 when the lip 166 is received within the mounting aperture. A tab mount 178 is located on the opposite side of the heat sink 114 relative to the lever mount 174, and defines a tab aperture 180 for receiving the second mounting tab 160 of the fan assembly. A top portion 182 of the tab mount projects above the top surfaces 125 of the cooling fins, and is dimensioned to be received within the gap 158 between the first mounting tabs 156 of the fan assembly.

The fan assembly 112 is detachably mounted to the heat sink 114 by placing the first mounting tabs 156 on the corresponding top surfaces 125 of the heat sink, so that the top portion 182 of the lever mount 178 is received within the gap 158. The other side of the fan assembly 112 is then lowered toward the heat sink so that the sloped surface 168 of the mounting latch 162 engages the recessed surface 177 of the lever mount. The fan assembly 112 is then pressed downwardly toward the heat sink 114, which in turn drives the sloped surface 168 downwardly and into engagement with the edge of the recessed surface 177, and causes the flexible leg 164 and lip 166 to flex inwardly toward the frame 132. When the lip 166 reaches the mounting aperture 176, the lip snaps into the mounting aperture, and the stops 172 engage the surface 177 preventing further downward movement of the fan assembly and locking the fan to the heat sink. The flexible nature of the leg 164 normally biases the lip 166 into the aperture 176. The fan assembly 112 can subsequently be removed from the heat sink by depressing the lever 170 toward the frame 132, which in turn releases the lip 166 from the mounting aperture 176. The fan assembly 112 can then be rotated upwardly and removed from the heat sink 114.

The wire leads 144 may either soldered directly to terminals (not shown) coupled to the microprocessor, or attached to a suitable connector (not shown) for attachment to a corresponding connector coupled to the microprocessor. The wire leads 144 may also be coupled to a suitable electrical connector mounted on the fan assembly for automatically making the electrical connection between the fan and the microprocessor upon attachment of the fan assembly to the microprocessor, as in the embodiment of the present invention described above.

As with the embodiment of the present invention described above, one advantage of this embodiment is that the fan assembly can be detached and replaced by a new fan assembly, quickly and easily, without requiring any special expertise or tools. Another advantage of the above-described embodiments of the present invention, is that because the fan assembly is easily and rapidly detachable from the heat sink, it provides significant advantages in assembling the heat sink to the microprocessor. As described above, the heat sink is typically attached to the microprocessor by applying a heat-conductive epoxy or adhesive to the interface between the heat sink and the microprocessor. Typically, the epoxy must be thermally cured to maximize the strength of the bond between the microprocessor and the heat sink, and the relatively high temperatures necessary to cure the epoxy or adhesive may damage plastic components of the fan assembly. With the apparatus of the present invention, however, the heat sink can be attached to the microprocessor, and the epoxy can be thermally cured without having the fan assembly attached to the microprocessor. Then, once the epoxy is cured, the fan assembly can be mounted to the heat sink, as described above. Thus, with the apparatus of the present invention, the potential for damage to the fan assembly by thermal curing is avoided.

Figure 9:
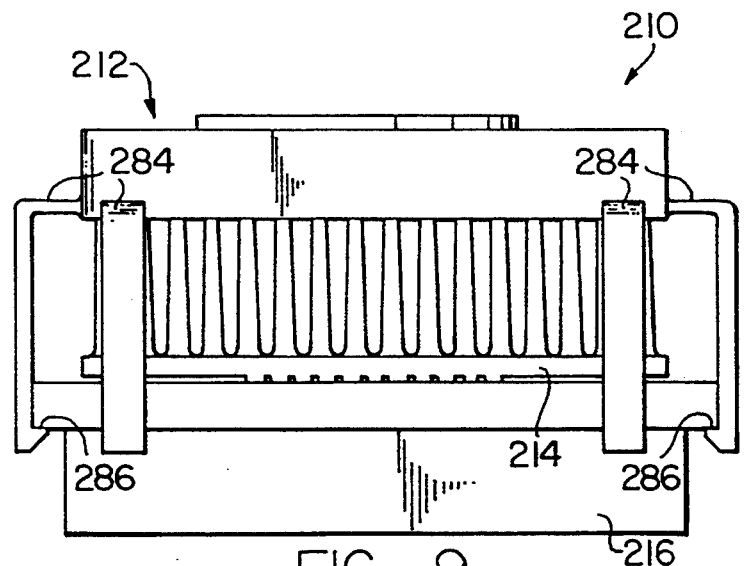
FIG. 9 is an end plan view of another embodiment of a cooling apparatus of the present invention, in which the fan assembly is detachably mounted to the microprocessor by several tabs.
Figure 10:
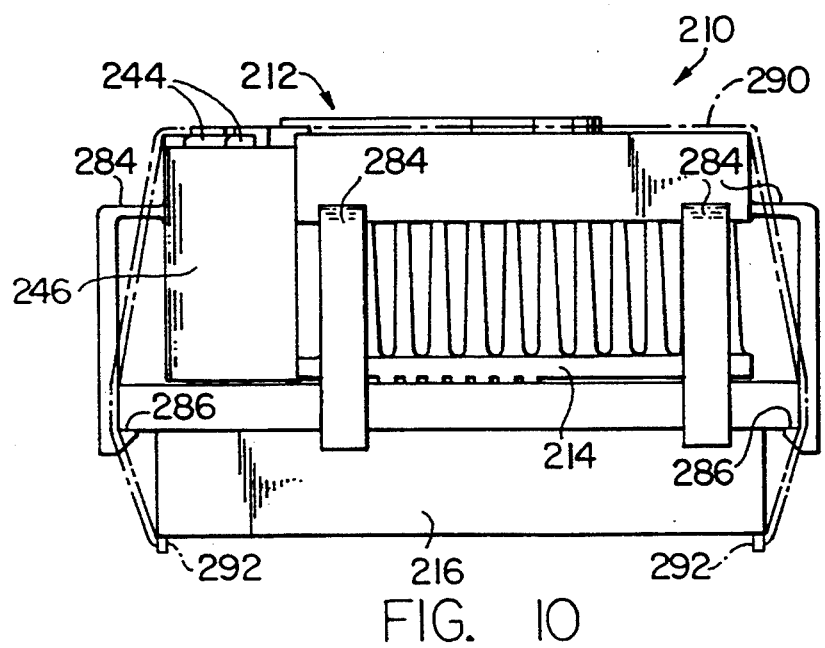
FIG. 10 is a side plan view of the cooling apparatus of FIG. 9.

Turning to FIGS. 9 and 10, another embodiment of the present invention is indicated generally by the reference numeral 210. The apparatus 210 is similar in certain respects to the apparatus 110 described above with reference to FIG. 8, and therefore like reference numerals preceded by the numeral 2 instead of the numeral 1 are used to indicate like elements.

The fan assembly 212 includes eight tabs 284, spaced relative to each other in pairs on each side of the assembly, and projecting downward adjacent to the corresponding edges of the microprocessor 216. Each tab 284 defines a lip 286 on its free end projecting inward toward the microprocessor, and dimensioned to be received within a corresponding recess formed beneath an edge of the microprocessor. The tabs 284 are each formed of a flexible material, such as a suitable plastic, and are each oriented substantially normal to the top surface of the microprocessor, as illustrated in FIG. 10.

The heat sink 214 may be attached to the microprocessor in the same manner as the heat sinks described above, such as by a heat-conductive adhesive. The fan assembly 212 is detachably mounted to the heat sink/microprocessor assembly by placing the fan assembly over the heat sink so that each lip 286 rests against a corresponding top edge of the microprocessor. The fan assembly 212 is then pressed downwardly toward the microprocessor, which drives the lips 286 into engagement with the corresponding edges of the microprocessor, and causes the tabs 284 to flex outwardly away from the microprocessor until the lips are received into the corresponding recesses, as shown in FIG. 10. The flexible nature of the tabs causes them to normally bias the lips 286 into the recesses to detachably lock the fan assembly to the microprocessor. The fan assembly is detached by pulling the tabs 284 away from the microprocessor, so as to release the lips 286 from the recesses, and by lifting the fan assembly upwardly away from the microprocessor. The wire leads 244 of the fan assembly are coupled to an electrical connector 246 so that the electrical connection between the fan and microprocessor is automatically made upon attachment of the fan to the heat sink/microprocessor assembly.

If desired, the fan and heat sink could be formed as an integral assembly, which would be detachably mounted to the microprocessor by the tabs 284. In this case, it would not be necessary to apply adhesive to the interface between the microprocessor and the heat sink. Also if desired, one or more bail wires 290 can be used instead of the tabs 284 to detachably mount the fan assembly to the microprocessor, as illustrated in dashed lines in FIG. 9. Each bail wire 290 is wrapped over the fan assembly and coupled on either end to clips 292 attached to the microprocessor.

As will be recognized by those skilled in the art, numerous modifications can be made to these and other embodiments of the present invention without departing from the scope of the invention as defined in the appended claims. For example, there are numerous structures for detachably mounting the fan assembly to the heat sink permitting the fan assembly to be quickly detached and replaced without requiring tools or special expertise, and which otherwise lock the fan assembly in place with respect to the heat sink during operation of the microprocessor. There are also numerous types of electrical connectors not specifically disclosed herein, which can function to connect the fan assembly to terminals on the microprocessor for controlling operation of the fan, upon attachment of the fan assembly to the heat sink. Accordingly, while the embodiments disclosed herein are illustrative of the present invention, they are not exhaustive, and numerous modifications can be made without departing from the scope of the present invention.

I claim:

1. An apparatus for cooling an electronic component having an exposed surface, comprising:
    a heat transfer body coupled to the exposed surface for transferring heat away from the electronic component;
    first means detachably mounted to the heat transfer body for moving air across the heat transfer body to enhance the transfer of heat away from the electronic component;
    second means for detachably mounting the first means to the heat transfer body; and
    third means mounted to the first means for electrically connecting the first means to the electronic component, the third means including a connector housing mounted between the first means and the electronic component, and a terminal coupled to the connector housing and engaged with a corresponding terminal on the electronic component.

2. An apparatus as defined in claim 1, wherein one of the first means and the heat transfer body defines at least one mounting recess, and the other defines at least one corresponding mounting surface received and retained within the mounting recess detachably mounting the first means to the heat transfer body.

3. An apparatus as defined in claim 2, wherein the at least one mounting surface forms an interference fit with a surface defining the corresponding mounting recess locking the mounting surface within the mounting recess.

4. An apparatus as defined in claim 3, wherein the at least one mounting surface is defined by a radius of curvature, and the corresponding mounting recess is defined by a surface having a radius of curvature forming an interference fit with the radius of curvature of the at least one mounting surface.

5. An apparatus as defined in claim 1, wherein the third means includes at least one biased terminal surface in engagement with the corresponding terminal on the electronic component to form an electrical connection with the electronic component.

6. An apparatus as defined in claim 5, wherein the heat transfer body defines a mounting surface forming an interface between the electronic component and the heat transfer body, and the biased terminal surface projects outwardly relative to the mounting surface in contact with the corresponding terminal on the electronic component.

7. An apparatus as defined in claim 1, wherein the first means comprises a fan including a plurality of fan blades spaced apart from each other along the periphery of the fan.

8. An apparatus as defined in claim 1, wherein the heat transfer body defines a heat transfer passageway for receiving and discharging air to cool the exposed surface of the electronic component, and the first means is disposed in the passageway to create air flow through the passageway.

9. An apparatus as defined in claim 1, wherein the second means includes a biased locking surface coupled to one of the first means and the heat transfer body, and a corresponding locking recess defined by the other of the first means and the heat transfer body receiving and retaining the the biased locking surface and detachably mounting the first means to the heat transfer body.

10. An apparatus for cooling an integrated circuit device, comprising:
    a heat transfer body defining a mounting surface mounted to the integrated circuit device to transfer heat away from the integrated circuit device;
    a fan assembly detachably mounted to the heat transfer body for moving air across the heat transfer body to enhance the transfer of heat away from the integrated circuit device;
    means for detachably mounting the fan assembly to the heat transfer body; and an electrical connector coupled to the fan assembly and including a connector housing and at least one terminal mounted to the connector housing, the connector housing extending between the fan assembly and the integrated circuit device with the connector terminal in engagement with a corresponding terminal on the integrated circuit device.

11. An apparatus as defined in claim 10, wherein the at least one terminal of the electrical connector is mounted adjacent to the mounting surface of the heat transfer body, and extends beyond the mounting surface toward the integrated circuit device and is biased into engagement with the corresponding terminal on the integrated circuit device.

12. An apparatus as defined in claim 10, wherein the means for detachably mounting includes a mounting surface defined by one of the heat transfer body and the fan assembly, and a corresponding mounting aperture defined by the other of the heat transfer body and the fan assembly for receiving and retaining the mounting surface to detachably mount the fan assembly to the heat transfer body.

13. An apparatus as defined in claim 12, further comprising means for biasing the at least one mounting surface into the corresponding mounting aperture.

14. An apparatus as defined in claim 12, wherein the at least one mounting surface is defined by a first radius of curvature, and a surface defining the corresponding mounting aperture is defined by a second radius of curvature forming an interference fit with the first radius of curvature.

15. An apparatus as defined in claim 10, wherein the heat transfer body defines a plurality of cooling fins and corresponding apertures between the cooling fins for fluid flow between the cooling fins, and the cooling fins define a plenum chamber receiving at least a portion of fan blades of the fan assembly.

16. An apparatus for cooling an integrated circuit device including an exposed surface, comprising:

a heat transfer body defining at least one mounting surface contacting the exposed surface of the integrated circuit device for the transfer of heat away from the integrated circuit device;

a fan assembly rotatably attached to the heat transfer body for moving air across the heat transfer body to enhance the transfer of heat away from the heat transfer body; and means for rotatably attaching the fan assembly to the heat transfer body and rotatably detaching the fan assembly for removal of the fan assembly from the heat transfer body and integrated circuit device, wherein said means includes at least one mounting surface formed on one of the heat transfer body and the fan assembly, and the other of the heat transfer body and the fan assembly defines a corresponding mounting recess receiving and retaining the mounting surface upon rotation of the fan assembly relative to the heat transfer body.

17. An apparatus as defined in claim 16, further comprising an electrical connector mounted on the fan assembly and electrically coupled to the fan assembly, the electrical connector including a connector housing extending between the fan assembly and the integrated circuit device and at least one biased contact surface projecting toward the integrated circuit device in biased engagement with at least one corresponding contact surface on the integrated circuit.

* * * * *